United States Patent [19]

Halpern et al.

[11] 3,891,443

[45] June 24, 1975

[54] MAT FINISH PHOTOSENSITIVE RELIEF PLATES

[75] Inventors: Gregory Halpern, Tarrytown, N.Y.; William Rowe, Westfield, N.J.

[73] Assignee: Polychrome Corporation, Yonkers, N.Y.

[22] Filed: Feb. 1, 1973

[21] Appl. No.: 328,632

[52] U.S. Cl. ...................... 96/79; 96/35.1; 96/36.3; 264/319

[51] Int. Cl. .............................................. G03c 1/72

[58] Field of Search ............ 96/115 P, 79, 81, 35.1, 96/36.3

[56] References Cited

UNITED STATES PATENTS

| | | | |
|---|---|---|---|
| 1,984,471 | 12/1934 | Fischer | 96/81 |
| 2,701,199 | 2/1955 | Damschroder et al. | 96/79 |
| 2,948,611 | 8/1960 | Barney | 96/115 P |
| 3,408,191 | 10/1968 | Jeffers | 96/35.1 |
| 3,503,315 | 3/1970 | DeMontebello | 96/81 |
| 3,615,468 | 10/1971 | Tiala | 96/79 |
| 3,677,920 | 7/1972 | Kai et al. | 96/115 P |

OTHER PUBLICATIONS

Uhlig, F-Screenless Offset . . . Jnl. of Photographic Science, Vol. 18, 1970. Only pp. 5 & 6.

*Primary Examiner*—David Klein

[57] ABSTRACT

Photosensitive plates for the preparation of relief printing plates, which photosensitive plates have a mat or grained surface on the photosensitive material. Novel process for the preparation of the mat or grained surface which comprises causing the photosensitive material to take the configuration of a grained or mat surface of another material, for example, a grained metallic plate or a mat finish plastic film. e.g., polyester film, or paper which has a mat finish surface. The light-sensitive material may be solvent-coated onto the mat or grained surface of the other material, dried and then the surface of the photosensitive material away from the side of contact with the mat or grained surface material may be laminated to a support which ultimately is used for mechanical support of the relief image in the exposed and developed plate and also for lock-up of the plate on the press.

2 Claims, No Drawings

MAT FINISH PHOTOSENSITIVE RELIEF PLATES

This invention relates to relief printing plates and more particularly to novel relief printing plates having a mat or grained surface, the advantages of which will be set forth hereinafter.

Relief printing plates of the photopolymerizable type are known and are commercially available. Examples of such commercially available plates are the "Dycril" plate marketed by du Pont, the "Nyloprint" plate marketed by BASF and the "Letterflex" system marketed by W. R. Grace & Co. All of these plates have a relatively smooth surface. The first two plates are solid and the third is a liquid photopolymer plate. The solid plates have relatively smooth surfaces and in use generally require a mat finish photographic transparency through which they are exposed.

Both negative and positive mat finish photographic film are available, but are relatively expensive and are believed to be available from only two sources. The mat finish transparency is required in order to enable the air to be evacuated between the transparency and the photosensitive relief plate, thereby insuring intimate contact between transparency surface and surface of the photosensitive plate. If such contact is not uniformly maintained, lateral transmission of light occurs where the contact is not intimate, thereby resulting in undercutting of the image, clogging of the image and also diffusion of the light to the extent that the exposure is not as focused and intense as it should be.

The image area where this occurs many times is not photopolymerized to the extent required so that it is relatively soluble in the developer. The developed relief image consequently tends to have rounded edges rather than sharp edges and the resultant printing therefrom tends to be less sharp and clear than desirable or required.

The photosensitive relief plates of this invention which have a mat or grained surface on the photosensitive material either do not have the disadvantages of the prior art plates which have smooth surfaces or do not have these disadvantages to the extent that the prior art plates have them.

The advantages of the photosensitive relief plates of this invention which have mat or grained surfaces are: (1) expensive mat finish photographic transparencies are not required for the exposure of the plate in order to facilitate air evacuation between the transparency and the photosensitive coating; (2) conventional negative and positive transparencies and conventional printing frames can therefore be used without any special precautions; (3) because of the good and uniform contact between the transparency and the surface of the photosensitive coating, lateral transmission of light is prevented or reduced thereby preventing undercutting or clogging of the image; (4) the mat or grained surface of the image areas in the exposed and developed plate contains numerous small depressions which function as wells for ink during printing—of course, this is not the case with a smooth surfaced image area; and (5) these depressions or wells are especially useful in flexographic printing processes because of their superior ink receptivity. The process for imparting a mat or grained surface to a photosensitive material, which may be in the form of either a supported or unsupported film, comprises bringing the photosensitive material into contact with a mat finish or grained surface in such a way that the photosensitive material takes on a mirror imprint of the mat finish or grained surface itself. Examples of materials having mat or grained surfaces are: mat finish paper, grained metal surface, for example, grained aluminum sheet, or grained thermoplastic film, e.g., grained polyethylene terephthalate film or web. In practice the light sensitive material may be caused to take the configuration of the mat or grained surface by means of pressure or heat or a combination of both, e.g., by passing a film of the photosensitive material and a grained aluminum sheet simultaneously through a pair of heated nip rollers so that the photosensitive material flows into the depressions of the mat or grain finished aluminum sheet. The photosensitive material may alternatively be in the form of a melt or a solution in a solvent, which melt or solution may be coated on grained or mat finished paper or thermoplastic web, preferably previously coated with a release agent, e.g., a silicone composition (so that the mat finish material may be subsequently removed from the light-sensitive material.)

The mat finishing or graining of the starting material may be accomplished in any suitable manner—sandblasting, brush graining with a wet graining mass, e.g., a slurry of pumice, chemical etching or electrolytic etching, etc. may be used, depending upon the starting material to be grained.

Paper which has not been calendered generally has a mat finish. The paper or other material may be given a mat finish by incorporating sufficient filler or pigment into a release agent which is then coated on the surface of the paper or other material. Preferably, the release agent is curable, in which case it is cured before being used to make the products of this invention. Pigments and fillers may also be incorporated in the photosensitive compositions to be used to make the products of this invention in order to impart a mat finish or to assist in imparting such a finish. Generally, there is a limit to the amount of filler which may be used because of increasing opacity with increasing amounts of filler.

The mat finish or grain of the material should not be so fine as to be ineffective for the purpose of the invention and should not be so coarse as to prevent relatively intimate contact between plate surface and transparency and to adversely affect the resolution required for the intended use of the photosensitive composition.

The mat finish of the material when inspected microscopically is seen to generally have projections and valleys on its surface. The preferred average height of a projection from an adjacent valley is in the range of about 0.2 to about 10 microns. More preferred generally are materials which have such average heights in a range of from about 0.2 to about 5 microns.

The light-sensitive material may be any of the materials used to make light-sensitive relief compositions. Particularly good results are obtained with any light-sensitive material for the production of a relief plate in which the light sensitive coating is solid at room temperature. For example, compositions like the Dycril or Nyloprint compositions might be used, thereby resulting in mat finishes for those plates rather than the smooth hard surfaces they presently have. The Dycril composition is believed to be a mixture of triethylene glycol diacrylate (monomer), cellulose acetate hydrogen succinate (Polymer), 2-ethylanthraquinone (photoinitiator) and p-methoxyphenol (polymerization inhibitor [stabilizer]). The Nyloprint composition, as its name would imply, is comprised of a nylon composition.

Particularly good results have been obtained with the plates prepared as described in copending application, Ser. No. 328,550, of William Rowe, Alfred Taudien and Albert S. Deutsch filed concurrently. Those plates are generally comprised of a photopolymerizable film which is comprised of a photopolymerizable composition comprised of an admixture of:

I. a polymer which is substantially comprised of the reaction product of (A) an organic polyisocyanate and (B) an organic compound containing at least about two active hydrogen atoms per molecule, said polymer having been end-capped by reaction with (C) an organic compound containing at least one active hydrogen atom and said end-capped polymers having viscosities of from about 5 to about 70 stokes when measured as a 30 percent solution in a mixture of approximately equal parts of xylol, methyl ethyl ketone and ethylene glycol monomethyl ether, at 25°C.;

II. an addition polymerization initiator activatable by actinic light; and

III. an addition polymerizable ethylenically unsaturated component capable of forming a polymer by photoinitiated polymerization in the presence of the initiator.

The unsaturated component may be an integral part of the polymer's structure, or it may be a separate compound admixed with the polymer and initiator. Relief images, especially useful for printing, may be prepared by exposure of a thickness of the composition to an ultraviolet light source through, e.g., a transparency which has relatively opaque and relatively translucent areas, and subsequent development of the image by application of a developer composition.

Preferred are photopolymerizable plates comprised of a support and adhered thereon a film of the photopolymerizable composition described above. The support may be a metal, plastic, fabric, paper or wood. The metal may be aluminum or steel. The plastic may be in the form of a flexible film. An adhesive or bonding agent may be used to imprint additional adhesion between the film and the support.

The film of the photopolymerizable composition may have a thickness of from about 3 to about 250 mils, preferably from about 10 to about 50 mils.

The polyisocyanate mentioned above may be a diisocyanate, preferably 4,4'-methylene bis (cyclohexyl isocyanate), tolylene diisocyanate, hexamethylene diisocyanate, 4,4'-diphenyl methane diisocyanate or diisocyanate derivatives of $C_{36}$ dimerized fatty acids.

The compound (B) mentioned above may be a polyhydric organic compound, preferably a condensation product of a lactone, especially ε-caprolactone. The condensation product preferably has a molecular weight of from about 400 to about 2,000.

Compound (B) may be a polyamine, preferably a diamine, especially m-phenylene-diamine, propylene-diamine, ethylene diamine or 2,4-tolylenediamine.

Compound (C) above may be a mono-active hydrogen containing compound, preferably containing olefinic unsaturation, having a hydroxyl, carboxyl or amino group and containing from about 2 to about 20 carbon atoms. Especially preferred as the compound (C) is hydroxyethyl acrylate or hydroxyethyl methacrylate, or cinnamyl alcohol.

The photopolymerizable compositions in the plates of Rowe et al. preferably have a viscosity in the range of from 5 to about 50 stokes, preferably from about 10 to about 30 stokes.

Most preferred are the compositions in the plates of Rowe et al. in which the polymers are comprised substantially of repeating units linked by urethane groups, said polymers being the products of (A) isocyanate-terminated intermediates produced from organic diisocyanates and polyhydric organic compounds having average molecular weights within the range of from about 400 to about 1,200, and (B) organic diamines in an amount of up to about 5 percent, based on the total weight of the resultant chain-extended polymers, said chain-extended polymers having been end-capped by reaction with (C) organic compounds containing one active hydrogen and said end-capped polymer having essentially no free isocyanate groups and a viscosity of from 5 to about 70 stokes when measured as a 30 percent solution in a mixture of approximately equal parts of xylol, methyl ethyl ketone and ethylene glycol monomethyl ether, at 25°C. Preferably the compositions are end-capped with a hydroxy-containing compound. Polymer I above preferably contains olefinic unsaturation and is present in an amount of from about 5 to 95 percent be weight of the composition, most preferably in an amount of from about 10 to 60 percent by weight of the composition.

The composition preferably contains as the photoinitiator an acyloin ether or Michler's Ketone, in an amount of from 0.01 to about 10.0 percent based on the total composition, most preferably in an amount of from about 0.1 to about 5.0 percent.

Preferably there is present as component III a polymerizable mono-ethylenically unsaturated monomer in an amount of from about 10 to about 60 percent by weight of the composition. There may be present as component III a crosslinker having at least two ethylenically unsaturated groups in an amount up to about 90 percent by weight of the composition, especially in an amount up to about 50 percent by weight of the composition.

Preferably there is present a vinyl polymerization inhibitor in an amount of from 50–1,000 p.p.m. There may be present a preformed compatible condensation or addition polymer in an amount up to about 90 percent by weight of the composition, and/or an inorganic filler in an amount of up to about 40 percent by weight of the composition. There may also be present a liquid or semiliquid plasticizer in a plasticizing amount, a pigment or dye and/or a heat activatable curing agent, e.g., a peroxide in an amount of up to about 5 percent by weight of unsaturated component in the composition.

The following examples are illustrative of this invention. As will be obvious to those skilled in the art, modifications of the procedures described in the examples may be employed without departing from the scope of the invention.

EXAMPLE 1

A urethane prepolymer was prepared by reacting at approximately 100°C. one equivalent (415gms) of a caprolactone diol with a molecular weight of 830 (commercially available from Union Carbide Corp. under the tradename Niax polyol D 520 or PCP 0210) with two equivalents (198 gms) of 4,4'-methylene bis cyclohexyl diisocyanate, (commercially available from du Pont as Hylene W or from Allied Chemical as Nacconate $H_{12}$), an NCO/OH equivalent ratio of 2/1. The reaction was conducted under essentially anhydrous conditions, in sufficient urethane grade Xylol that the resulting prepolymer comprised 67 percent, and for a period of time to attain a free NCO content of between 3.3 – 3.5 weight percent and a viscosity (Gardner-Holdt 1933) of approximately Y – Z. To the urethane prepolymer mixture, cooled to 25°C, there was then added over a period of 2 hours a quantity of ethylene diamine, dissolved in ethylene glycol monomethyl ether (methyl Cellosolve) and methyl ethyl ketone (equal parts) as the solvent system. The amount of solvent was calculated to bring the total nonvolatile content to 31 percent, and the amount of diamine was calculated to bring the weight percent free NCO to 0.2 – 0.3 percent. The reaction mass was held at 25°–30°C until there was attained a constant free NCO of 0.2 – 0.3 weight percent. The viscosity was approximately X–$Z_1$ (Gardner-Holdt 1933). The extended polymer solution was then heated to 60°C, and there was added 0.05 percent (based on the weight of polymer) of dibutyl tin dilaurate, dissolved in ethylene glycol monomethyl ether and methyl ethyl ketone (equal parts), in an amount calculated to further reduce the percent nonvolatiles to 30 percent. The percent free NCO was reduced to 0 percent by terminating the polymer with the monohydroxyl compound, ethylene glycol monomethyl ether. The resultant solution of polyurethane polyurea polymer terminated with the monohydroxy compound was clear and water white, with a viscosity (Gardner-Holdt 1933) of approximately X–Z.

EXAMPLE 2

Into a 2-liter, 3-necked glass flask were charged 710 grams Toluol, 204.5 grams mono pentaerythritol, 1.5 grams $Cu_2O$ (inhibitor), 23.0 gms. conc. $H_2SO_4$ (66° Be) (catalyst), 3.75 g. Hydroquinone methyl ether (inhibitor) and 648.0 gms. of glacial acrylic acid. The charge was heated to 100°–110°C. under inert atmosphere and agitation and water of reaction was azeotropically distilled. The reaction was continued at 100°–110°C. until the water of reaction indicated that the tetraacrylate had been formed. The reaction mass was cooled to room temperature and washed successively with Na Cl + $NaHCO_3$ solutions until neutral, then filtered. The resultant solution contained 47.8 percent of pentaerythritol tetraacrylate (PETA) dissolved in toluol to which was added 400 PPM of hydroquinone methyl ether.

EXAMPLE 3

A photocurable solution was prepared by mixing 1,000 grams of the polyurethane polyurea mixture (30 percent non-volatile) from Example 1, 250 grams of PETA, at 47.8 percent non-volatile from Example 2, 45 grams of Cab-o-sil (commercially available from Cabot Inc.), 0.065 grams of methylene blue. The solution was then passed over a three roll paint mill until the Cab-o-sil was uniformly ground in and a heavy paste was obtained. To the paste was added enough benzoin methyl ether so that a ratio of 1 gm. of benzoin methyl ether to 100 gms. of polyurethane-polyurea solids was attained, i.e., 1 percent initiator based on the polymer solids. The benzoin methyl ether was added under yellow light, and the final product packaged and stored in brown glass, or in the absence of white light.

A suitable mold for making a printing plate was then prepared by (a) spraying a grained polyester sheet (available commercially from Direct Reproduction Corp.), in practice a 7.5 mil sheet 16 × 20 inches was suitable, with a 1–2 percent solids curable silicone system comprised, e.g., of products available from Dow Corning as Dow Corning Silicone 23 and Dow Corning Catalyst 23A mixed and reduced to 1–2 percent with Toluene, the silicone-treated polyester sheet then being allowed sufficient time to air cure at room temperature so as to keep the sheet essentially flat; and (b) mounting a rectangular metal frame, O.D. 12 × 18 inches and I.D. 10 × 16 inches, and 125 mils in height, on the silicone treated polyester sheet by means of 2 inches wide double stick tape.

The photocurable composition was reduced to 20 percent non-volatile content so that the final cast film would be held closely to 25 mils thickness. The reduced photocurable composition was deaerated under vacuum to remove bubbles, the mold vacuumed clean of all extraneous particles, and the mold carefully filled with the diluted photocurable composition. The excess was doctored off with care so that no air bubbles were reintroduced. The mold filled with the diluted photocurable composition was allowed to dry by solvent evaporation at room temperature overnight, and to subsequently remove the last traces of solvent, conditioned in an oven for 24 hours at 120°–140°F. The solid photocurable material, on the mat-finish siliconized polyester, was now cut free of the frame and mounted on an aluminum plate (usually a pregrained, anodized and presensitized plate, commercially available from Polychrome Corporation as their GA plate) with the photocurable material toward the aluminum and the polyester away from it, by nipping through rubber or metal rolls at room temperature, taking care that no air bubbles were introduced between the aluminum plate and the photocurable composition, and the contact was intimate and continuous. The plate after nipping was further treated in a dry mounting press for 60 seconds at a glue line temperature of approximately 140°F. (to insure excellent adhesion). The plate was allowed to cool to room temperature under weight to insure a flat plate.

The polyester sheet was removed and a non-mat finish line negative transparency was placed on top of the mat-finish photocurable coating on the aluminum plate. The photocurable composition of 25 mils thickness was exposed through the transparency to a black light source for 5 minutes in a Master No. 2943 Flat Cold Light Exposure Unit, 115 volts, 1 phase, 60 cycles using G. E. Black Light Fluorescent Tubes (commercially available from Master Sales and Service Corp.). The negative readily made uniform intimate contact with the plate upon application of vacuum. The plate was 1¾ inches from the black light tubes. (¼ inch separation between tubes.) The exposed plate was then developed in a Sixt Washout Unit, Model MA 34S (commercially available from Sixt Co. in Germany) for 3 minutes. The developer was a mixture of 80 parts methyl Cellosolve acetate and 20 parts water. The developed plates were washed with fresh solvent and blown out with compressed air and then dried in a forced draft of warm air for a few minutes. The plate so prepared was properly exposed, the image areas had "shoulders," there was no visible undercutting or clogging and the plate was ready for press mounting. A plate so prepared and mounted on a direct printing press produced results of exceptionally high print quality running 200,000 impressions at which time the test was discontinued. This plate had a Short Durometer Hardness 92A.

EXAMPLE 4

A mat finish paper web (approximately 6 mils thick) which had been treated with a release agent on its mat finish surface was transported with that surface up, through a knife-coating stage, and a 50 mil layer of the coating solution described in Example 3 was deposited on it. After drying, the resultant coating on the release paper was nip rolled onto a 10 mil aluminum substrate having a 2 mil adhesive layer. The two layers were thereby bonded together. The adhesive layer was an amine-catalyzed grey-pigmented gloss coating which had been allowed to flash free of solvent. Prior to use the release paper, which also serves as a strippable protective covering, was removed, revealing a plate surface which has a mirror imprint of the paper's mat surface.

What we claim is:

1. A photosensitive plate for the preparation of relief printing plates which photosensitive plate has a layer of a photopolymerizable composition and, in conjunction therewith, a strippable material with a mat or grained surface in intimate contact with the photopolymerizable layer whereby a mirror image mat or grained surface has been imparted to the surface of the photopolymerizable layer, said strippable material being adapted for removal before exposure of the photopolymerizable composition without disturbing the mat surface of the photopolymerizable layer, by being coated, at least on the surface adjacent said photopolymerizable composition, with a release agent.

2. The photosensitive plate of claim 1, wherein said photopolymerizable composition layer is 5 – 50 mils thick and said mat or grained surface is substantially comprised of minute projections and depressions generally in an alternating pattern, the average height of a projection from an adjacent depression being in the range of from about 0.2$\mu$ to about 5.0$\mu$.

* * * * *